(12) United States Patent
Matsuda

(10) Patent No.: US 6,319,734 B1
(45) Date of Patent: Nov. 20, 2001

(54) METHOD FOR ESTABLISHING DIFFERENTIAL INJECTION CONDITIONS IN MOSFET SOURCE/DRAIN REGIONS BASED ON DETERMINING THE PERMITTED AMOUNT OF ENERGY CONTAMINATION WITH RESPECT TO DESIRED JUNCTION DEPTH

(75) Inventor: Tomoko Matsuda, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/451,557

(22) Filed: Dec. 1, 1999

(30) Foreign Application Priority Data

Dec. 2, 1998 (JP) ................................. 10-342636

(51) Int. Cl.$^7$ ................................. H01L 21/66
(52) U.S. Cl. ..................... 438/14; 438/514; 438/530; 250/492.21
(58) Field of Search .................. 438/14, 301, 514, 438/516, 530; 250/492.2, 492.21

(56) References Cited

U.S. PATENT DOCUMENTS 5,969,366 * 10/1999 England et al. .

OTHER PUBLICATIONS

T. Yasunaga, S. Matsuda, S. Shishiguchi, and S. Saito, "Effect of Energy Reduction in Sub–keV Boron Implantation Ultra–Shallow Formation," 1998 International Conference on Ion Implantation Technology Proceedings, vol. 1, pp. 18–21, Jun. 1998.*

M. Halling and W. Krull, "Quantitative Measurements of Energy Contamination in ULE2 Deceleration," 1998 International Conference on Ion Implantation Technology Proceedings, vol. 1, pp. 586–589, Jun. 1998.*

J. Freeman et al IIT Conference Proceedings; 1992 p. 357.

* cited by examiner

Primary Examiner—Charles Bowers
Assistant Examiner—Stephen W. Smoot
(74) Attorney, Agent, or Firm—Hayes, Soloway, Hennessey, Grossman & Hage, P.C.

(57) ABSTRACT

A method for establishing conditions of making an index representing characteristics of a MOSFET in a permitted range by means of differentially injecting ions into a wafer. The method includes the steps of: making a curve indicating an amount of energy contamination with respect to a junction depth, and determining a permitted amount of energy contamination with respect to a desired junction depth. A MOSFET having substantially no deterioration of the characteristics can be obtained by referring to the curve, and establishing a degree of vacuum of and/or a distance of a beam line.

6 Claims, 6 Drawing Sheets

METHOD FOR ESTABLISHING DIFFERENTIAL INJECTION CONDITIONS IN MOSFET SOURCE/DRAIN REGIONS BASED ON DETERMINING THE PERMITTED AMOUNT OF ENERGY CONTAMINATION WITH RESPECT TO DESIRED JUNCTION DEPTH

BACKGROUND OF THE INVENTION (a) Field of the Invention

The present invention relates to a method for establishing conditions of differential injection for manufacturing a semiconductor device.

(b) Description of the Related Art

In order to reduce a short channel effect in a deep sub-quarter micron MOSFET, extremely shallow source/drain regions having a junction depth below 50 nm is required. Low energy injection is one method of realizing such a shallow junction. However, the low injection energy reduces the amount of beam current to lower the productivity.

A differential injection method is employed as an ion injection method which has overcome the above problem. Before describing the differential injection method, an ordinary drift injection method will be described for comparison.

In a drift injecting apparatus shown in FIG. 1, an extraction electrode 10 extracts beams from an ion source 12 and injects the beams into a wafer 16 through a beam line 14. The productivity is poor when the low energy injection is employed by the drift injecting apparatus.

In an ion injection apparatus employing the differential injection method shown in FIG. 2, the extraction electrode 10 extracts beams from the ion source 12 at an energy higher than the injection energy to the wafer. The extracted beams pass through the beam line 14 and are injected to the wafer 16 immediately after the speed of the beams is reduced to that corresponding to the desired injection energy by a speed-reducing electrode 18 immediately before the injection.

A beam current having a large energy is obtained in the differential injecting apparatus to elevate the productivity because the energy supplied to the ions by the extraction electrode 10 can be made higher.

However, the differential injection is accompanied with a problem of energy contamination (refer to J. Freeman et al., IIT Conference Proceedings, 357(1992)). Since the ion beams pAss within the beam line, the ion beams interact with atoms and molecules of residual gases in the beam line. The interaction called "charge exchange" proceeds as follows.

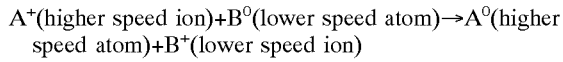

As a result of the interaction, a higher speed ion $A^+$ is converted into a neutralized ion $A^0$. The neutralized ion reaches to the wafer at an energy different from desired injection energy without being affected by an s electric field of the speed-reducing electrode. That is, it may occur that the speed of the neutralized ions is not reduced by the speed-reducing electrode and the ions are injected at the initial speed of extraction from the extraction electrode. Thus, the ions are deeply injected and the depth of the junction is made deeper.

Such neutralized ion injection is called "energy contamination" and the injected ions are called "contaminated ions".

The energy contamination occurring in the differential injection causes deterioration or variations in the characteristics of the device.

The amount of the energy contamination is generally expressed as a ratio (%) between (the amount of dosage when the energy contamination exist) and (the amount of dosage when no energy contamination exist). In order to suppress the deterioration, the amount of the energy contamination should be in the range providing allowable deterioration of the device characteristics The permitted range is, for example, prescribed in the load map of SIA (Semiconductor Industry Association).

Accordingly after obtaining the permitted range of the amount of the energy contamination prescribed in the SIA load map, the device characteristics within the range can be obtained by either ① increasing the degree of vacuum of the beam line in the ion injection apparatus or ② reducing the distance in the beam line, to make the amount of the energy contamination at or below the permitted value.

SUMMARY OF THE INVENTION

In view of the foregoing, an object of the present invention is to provide a method for establishing conditions for manufacturing a semiconductor device having characteristics in the permitted range by evaluating influences of energy contamination to the characteristics.

The present invention provides, in a method for establishing conditions of making an index representing characteristics of a MOSFET in a permitted range by adjusting a degree of vacuum of and/or a distance of a beam line in an ion injection apparatus based on a condition in order to form source/drain regions of the MOSFET by means of differentially injecting ions into a wafer, the improvement including the steps of: making a curve indicating an amount of energy contamination with respect to a junction depth, and determining, as said condition, a permitted amount of energy contamination with respect to a desired junction depth.

In accordance with the present invention, the MQSFET having the characteristics within the permitted range can be obtained, when the source/drain regions of the MOSFET are formed by employing a differential injection apparatus, by preparing the curve indicating the amount of the permitted energy contamination, determining the permitted value of the energy contamination by referring to the curve, and establishing the degree of vacuum of and/or the distance of the beam line in the ion injection apparatus.

The above and other objects, features and advantages of the present invention will be more apparent from the following description.

PREFERRED EMBODIMENTS OF THE INVENTION

Now, the present invention is more specifically described with reference to accompanying drawings.

Manufacture of source/drain regions of a MOSFET in a semiconductor device by employing a differential injection method to an embodiment of the present invention selects the threshold voltage (Vt) of the MOSFET as an index of indicating characteristics of the MOSFET.

In accordance with the SIA load map, 3 σ—variation (permitted range) of the threshold voltage Vt is prescribed for every generation of the MOSFETs as shown in Table 1. In the following embodiments, graphs will be prepared which show a relation between the junction depth and the permitted value of the amount of energy contamination for providing the permitted range (±40 mV) of the threshold value Vt, which is required in the MOSFET of generation of the year 2006 (design rule of 100 nm).

TABLE 1

| Year of First Product Shipment Technology Generation (design rule) | $V_T$ 3 σ - Variation (mV) (for minimum L. device) |
|---|---|
| 1997 (250 nm) | 60 |
| 1999 (180 nm) | 50 |
| 2001 (150 nm) | 45 |
| 2663 (130 nm) | 40 |
| 2006 (100 nm) | 40 |
| 2009 (70 nm) | 40 |
| 2012 (50 nm) | 40 |

Figure 1:
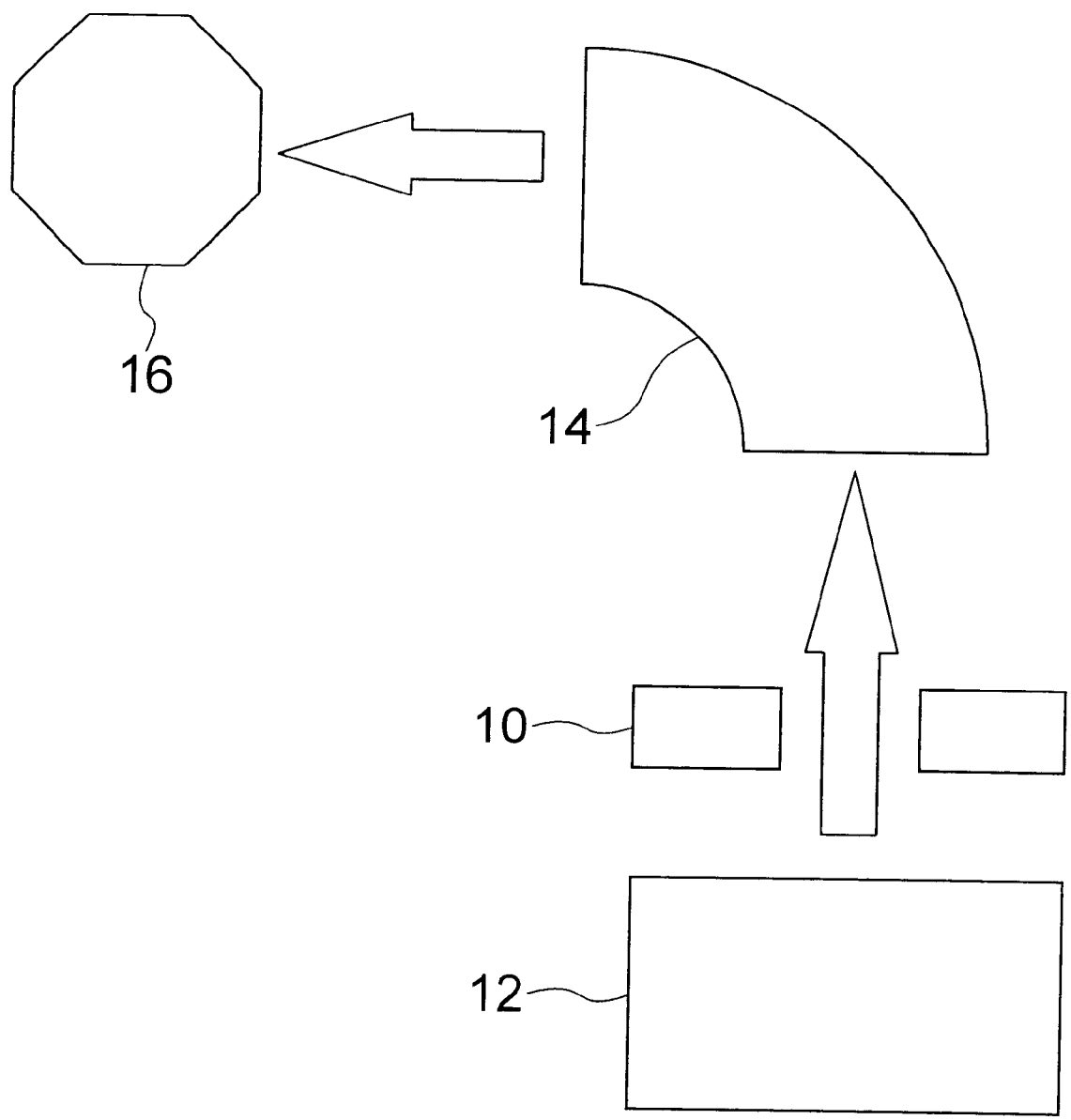
FIG. 1 is a schematic view showing a conventional drift injection apparatus.
Figure 3A:
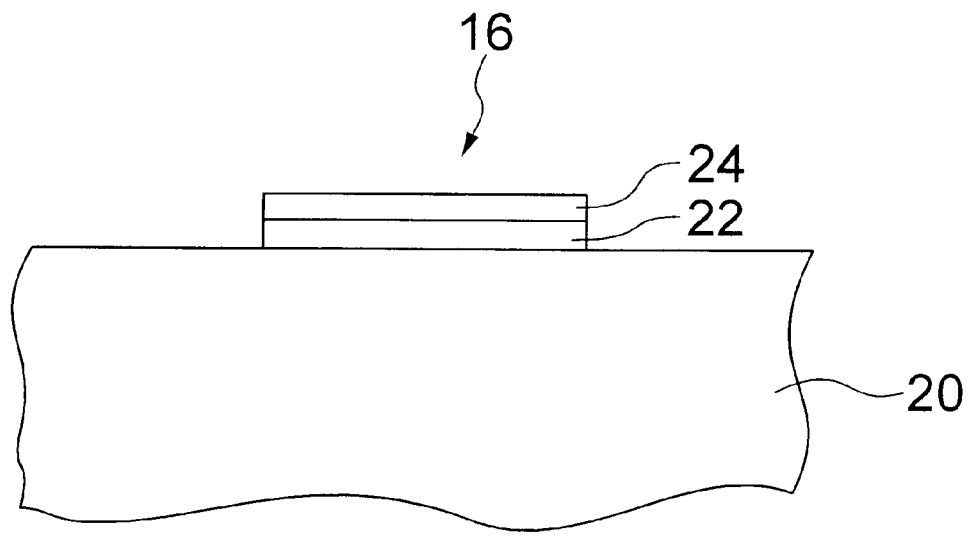
FIGS. 3A and 3B are vertical sectional views showing a wafer during consecutive manufacturing steps thereof.
Figure 3B:
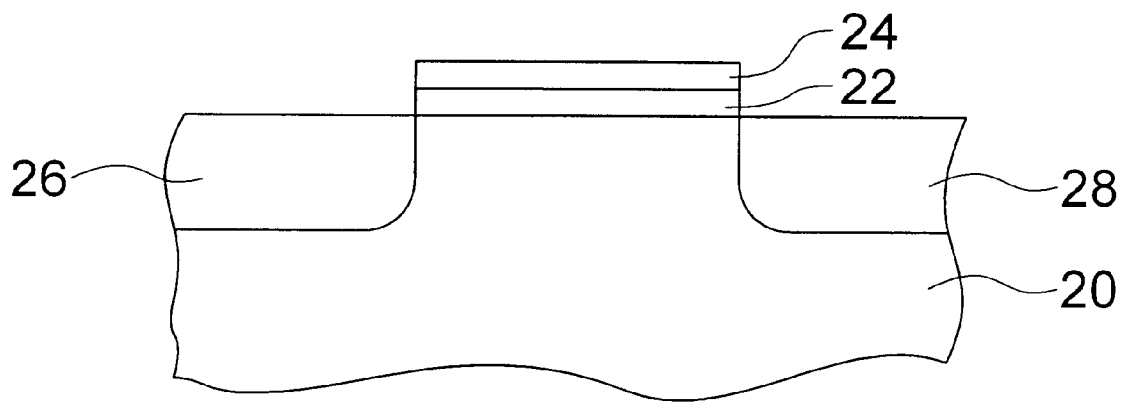

Five samples of wafers 16 having an oxide layer 22 and a gate 24 having a gate length of 100 nm sequentially deposited on a silicon substrate 20 shown in FIG. 3A were manufactured. Ion injection of boron (B) was conducted on each of the wafers at a lower energy in which substantially no energy contamination occurs in the ion injection apparatus such as shown in FIG. 1. After the ion injection, the wafers were conveyed into a lamp heating furnace and subjected to rapid thermal annealing (RTA) under the conditions shown in Table 2. The above treatments provided the source 26 and the drain 28 shown in FIG. 3B.

TABLE 2

| Wafer No. | Ion Injection (Injection Energy, Dosage) | Annealing (temperature time) | Junction Depth (Å) | Threshold Voltage |
|---|---|---|---|---|
| 1 | 0.25keV $5 \times 10^{14}/cm^2$ | 950° C. 10 sec. | 243 | Vt(1) |
| 2 | 0.5keV $5 \times 10^{14}/cm^2$ | 950° C. 10 sec. | 332 | Vt(2) |
| 3 | 1.0keV $5 \times 10^{14}/cm^2$ | 950° C. 10 sec. | 520 | Vt(3) |
| 4 | 1.0keV $5 \times 10^{14}/cm^2$ | 1000° C. 10 sec. | 652 | Vt(4) |
| 5 | 1.0keV $5 \times 10^{14}/cm^2$ | 1050° C. 5 sec. | 690 | Vt(5) |

After a plurality of samples of the MOSFETs having a measure gate length of 100 nm were taken from each of the wafers, junction depths of each of the samples were measured and an average value thereof was calculated. The resultant average value of the junction depth is shown in Table 2.

Further, the average values of the threshold voltage Vt of the samples of each of the wafers were calculated. Vt was assumed to be equal to Vg which was obtained by measuring Id and Vg of the MOSFETs and specifying Vg corresponding to a specified Id in accordance with the rule provided in the SIA load map. The threshold voltages of each of the wafers thus obtained are represented by Vt(1), Vt(2), Vt(3), Vt(4) and Vt(5), as shown in Table 2.

In accordance with the SIA load map shown in Table 1, the permitted range of the threshold voltage of the MOSFET of the generation of the year 2006 is prescribed to be ±40 mV. Threshold voltage Vt of the wafer No.2, for example, having source/drain regions having a junction depth of 332 Å is permitted if it ranges within Vt(2)±40 mV.

The energy contamination reduces the threshold voltage Vt. Accordingly, the threshold voltage Vt of the MOSFET having the source/drain regions of the depth of 332 Å is permitted down to Vt(2)−40 mV. The permitted value of the amount of the energy contamination providing the permitted range for Vt is obtained in accordance with the following procedures.

Figure 2:
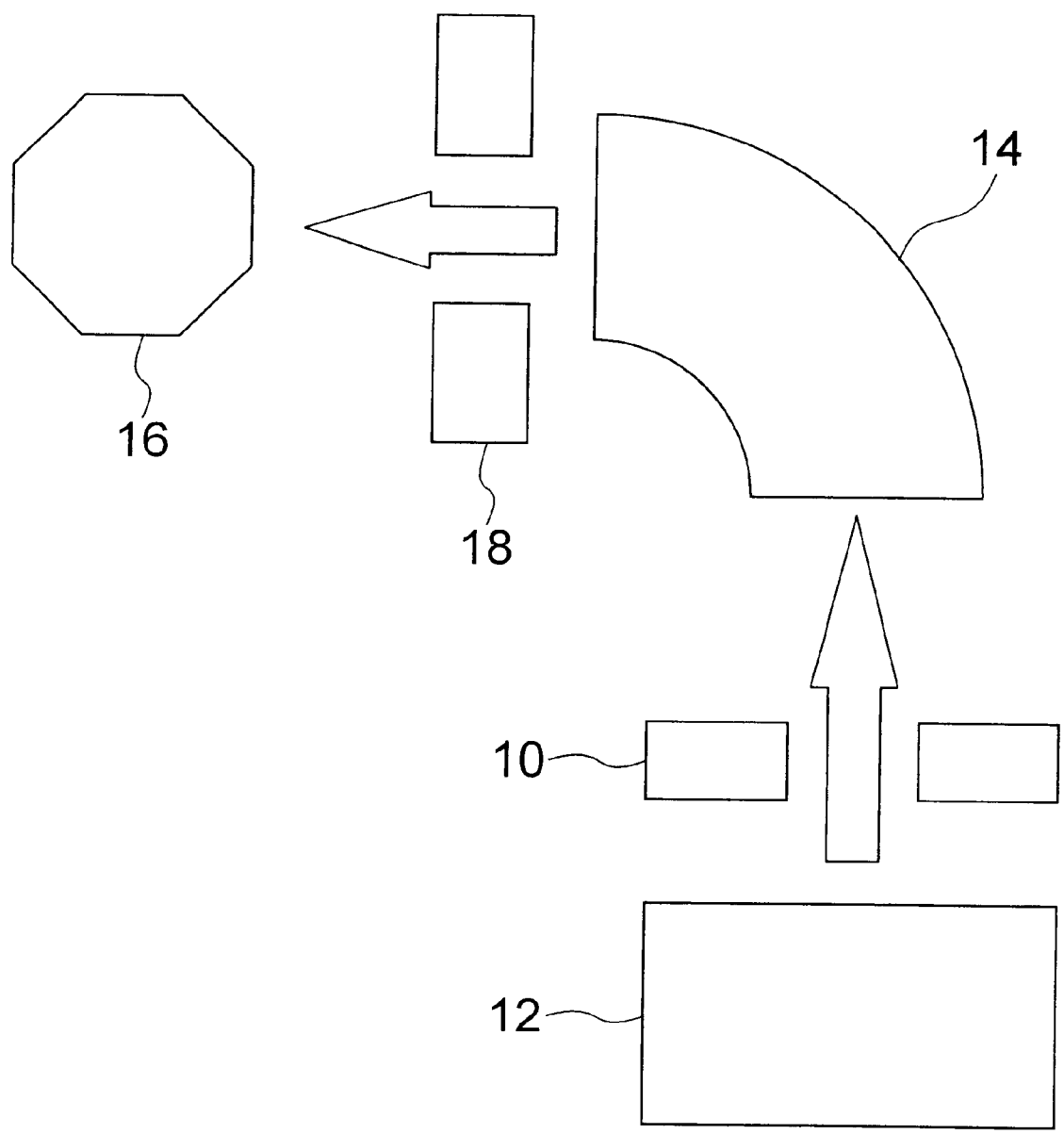
FIG. 2 is a schematic view showing another conventional drift injection apparatus employing differential injection.

Three samples of wafers shown in FIG. 3A were manufactured. Ion injection of boron (B) was conducted on each of the wafers at a higher energy shown in Table 3 in which the energy contamination occurs in the ion injection apparatus shown in FIG. 2. After the ion injection under the conditions of 0.5 keV and $5 \times 10^{14}/cm^2$, the wafers were conveyed into a lamp heating furnace and subjected to the RTA. The above treatments provided source/drain regions having a junction depth of 332 Å. The treatment conditions for each of the wafers were shown in Table 3.

TABLE 3

| Wafer No. | Ion Injection (Injection Energy Amount of Dosage) | Annealing (temperature, time) | Energy Contamination |
|---|---|---|---|
| 1 | 2 keV, $5 \times 10^{12}/cm^2$ 0.5 keV, $5 \times 10^{14}/cm^2$ | 950° C. 10 sec. | 1% |
| 2 | 2 keV, $1.5 \times 10^{13}/cm^2$ 0.5 keV, $5 \times 10^{14}/cm^2$ | 950° C. 10 sec. | 3% |
| 3 | 2 keV, $2.5 \times 10^{13}/cm^2$ 0.5 keV, $5 \times 10^{14}/cm^2$ | 950° C. 10 sec. | 5% |

Figure 4:
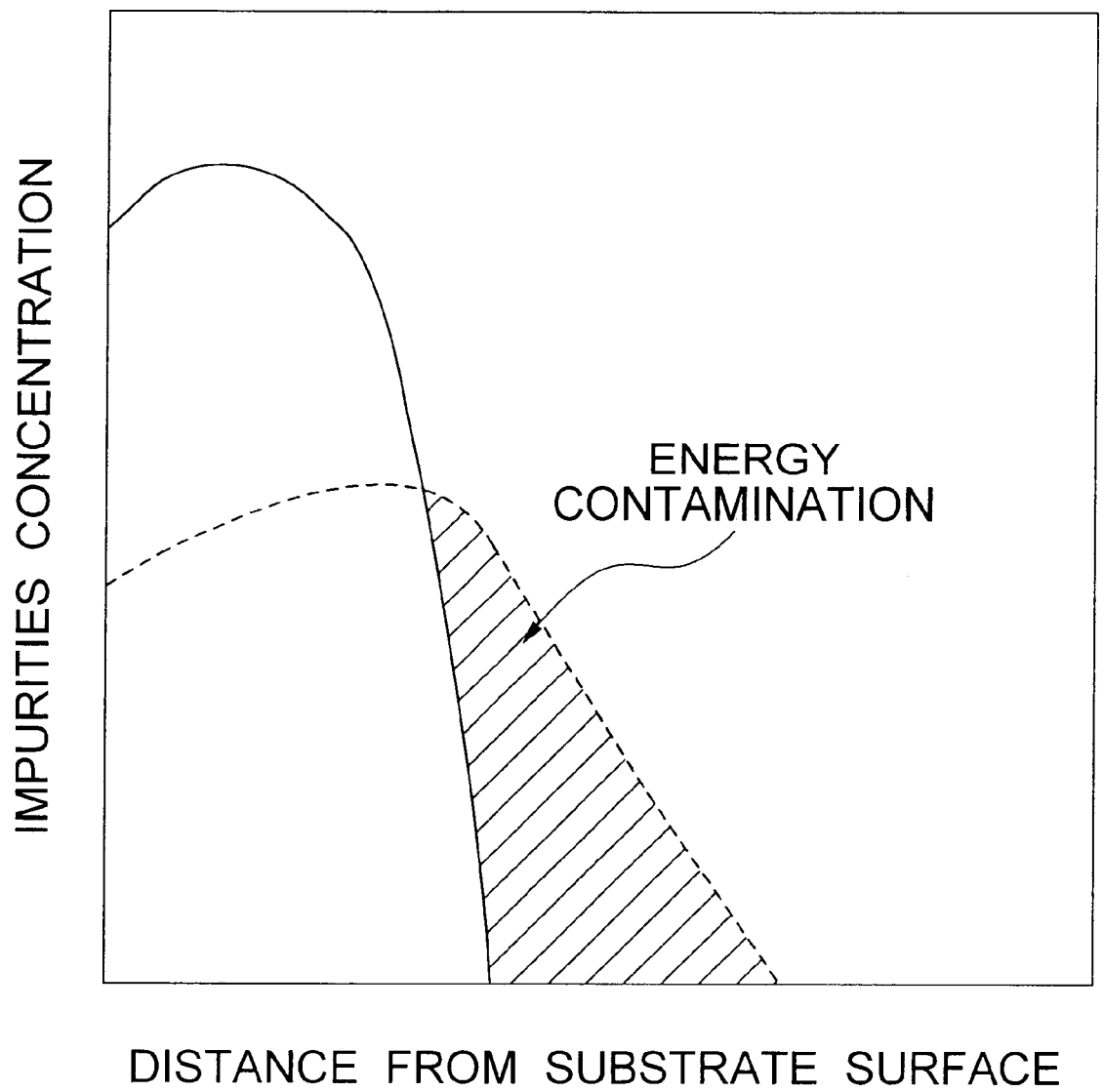
FIG. 4 is a graph illustrating energy contamination.

In Table 2, 0.5 keV and $5 \times 10^{14}/cm^2$ are obtained for the conditions of ion injection for manufacturing the MOSFET having the junction depth of 332 Å. Since the amount of the energy contamination is indicated, as shown in the scheme of FIG. 4, by a ratio (%) between (the amount of dosage when the energy contamination exist) and (the amount of dosage when no energy contamination exist), as described before, amounts of energy contamination generated under the ion injection conditions shown in Table 3 are 1%, 3% and 5%.

Threshold voltages (Vt) of the MOSFETs in the wafers manufactured in accordance with the conditions shown in Table 3 will be determined hereinafter. The threshold voltage is made to be lower than Vt(2) due to the energy contamination. The threshold voltages obtained by the treatment conditions Nos.1 and 2 in Table 3 were not lowered to below Vt(2)−40 mV, but that of No.3 was lowered to below Vt(2)−40 mV. This indicates the MOSFET having a threshold voltage in a permitted range can be manufactured when the amount of energy contamination is equal to or below 3%. In other words, the permitted value of the energy contamination is 3% for manufacture of a MOSFET having a junction depth of 332 Å.

TABLE 4

| Wafer No. | Junction Depth (Å) | Permitted Value of Energy Contamination |
| --- | --- | --- |
| 1 | 243 | 2% |
| 2 | 332 | 3% |
| 3 | 520 | 5% |
| 4 | 652 | 7% |
| 5 | 690 | 10% |

Although the permitted value of the energy contamination for making the threshold voltage Vt of the MOSFET in the wafer No.2 in Table 2 in the permitted range has been exemplarily determined, permitted values of energy contamination of the other wafers Nos. 1, 3, 4 and 5 can be similarly determined. The determined permitted values are shown in Table 4.

Figure 5:
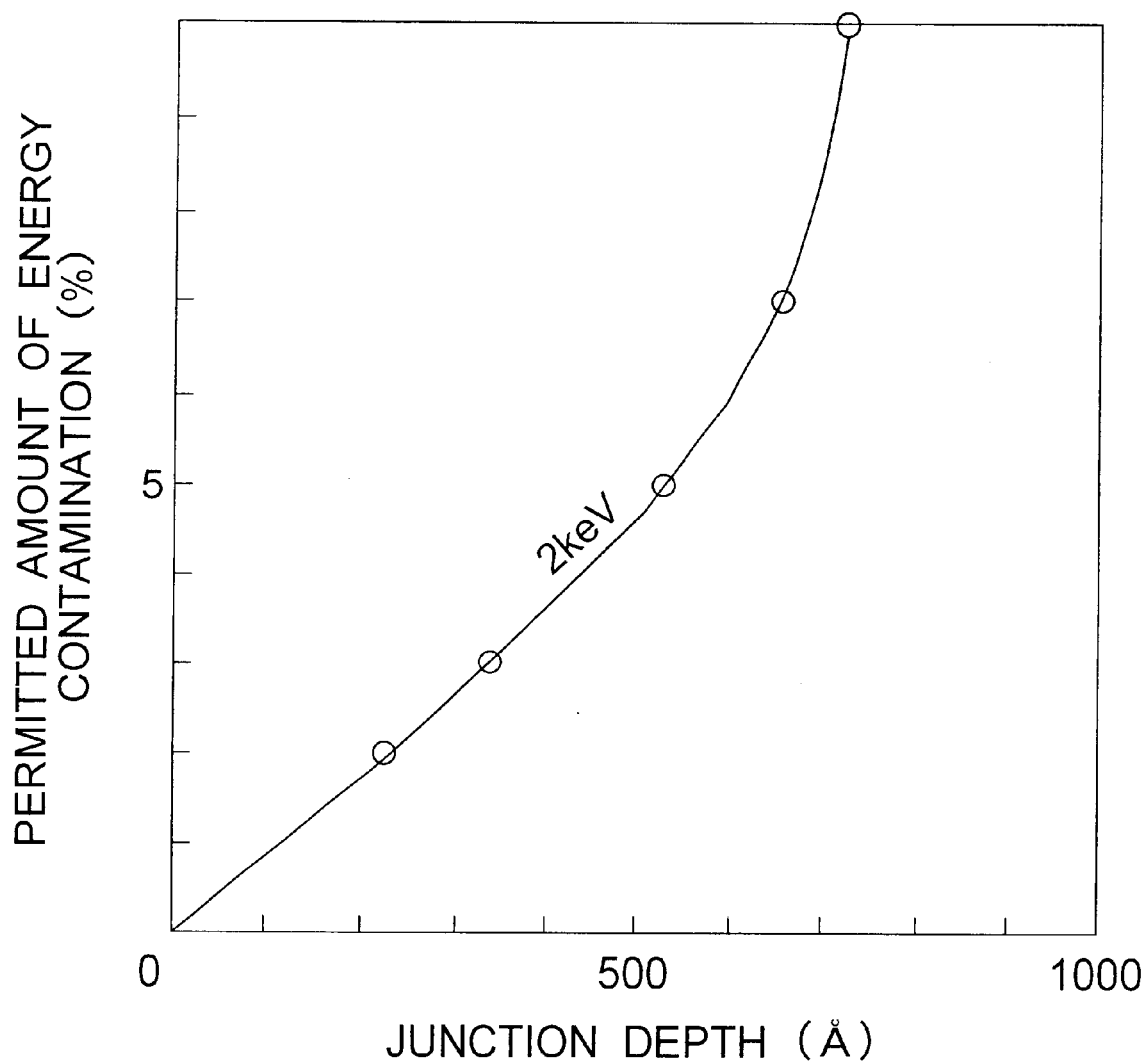
FIG. 5 is a graph showing a relation between a junction depth and a permitted amount of energy contamination for injection energy of 2 keV

After these five values in Table 4 are plotted in a graph shown in FIG. 5 having a junction depth (Å) on the abscissa axis and an amount of energy contamination on the ordinate axis, a curve is depicted by connecting the plots. This curve indicates that when source/drain regions of a MOSFET are formed by extracting ions at energy of 2 keV by the extraction electrode 10, reducing the speed of the ions to that corresponding to injection energy of 0.5 keV by the speed-reducing electrode 18 and injecting the ions having a dosage of $5 \times 10^{14}/cm^2$ into the wafer by means of differential injection, a threshold voltage in the permitted range specified in the SIA load map can be obtained if the amount of the energy contamination is suppressed in a region below the curve in the graph.

Figure 6:
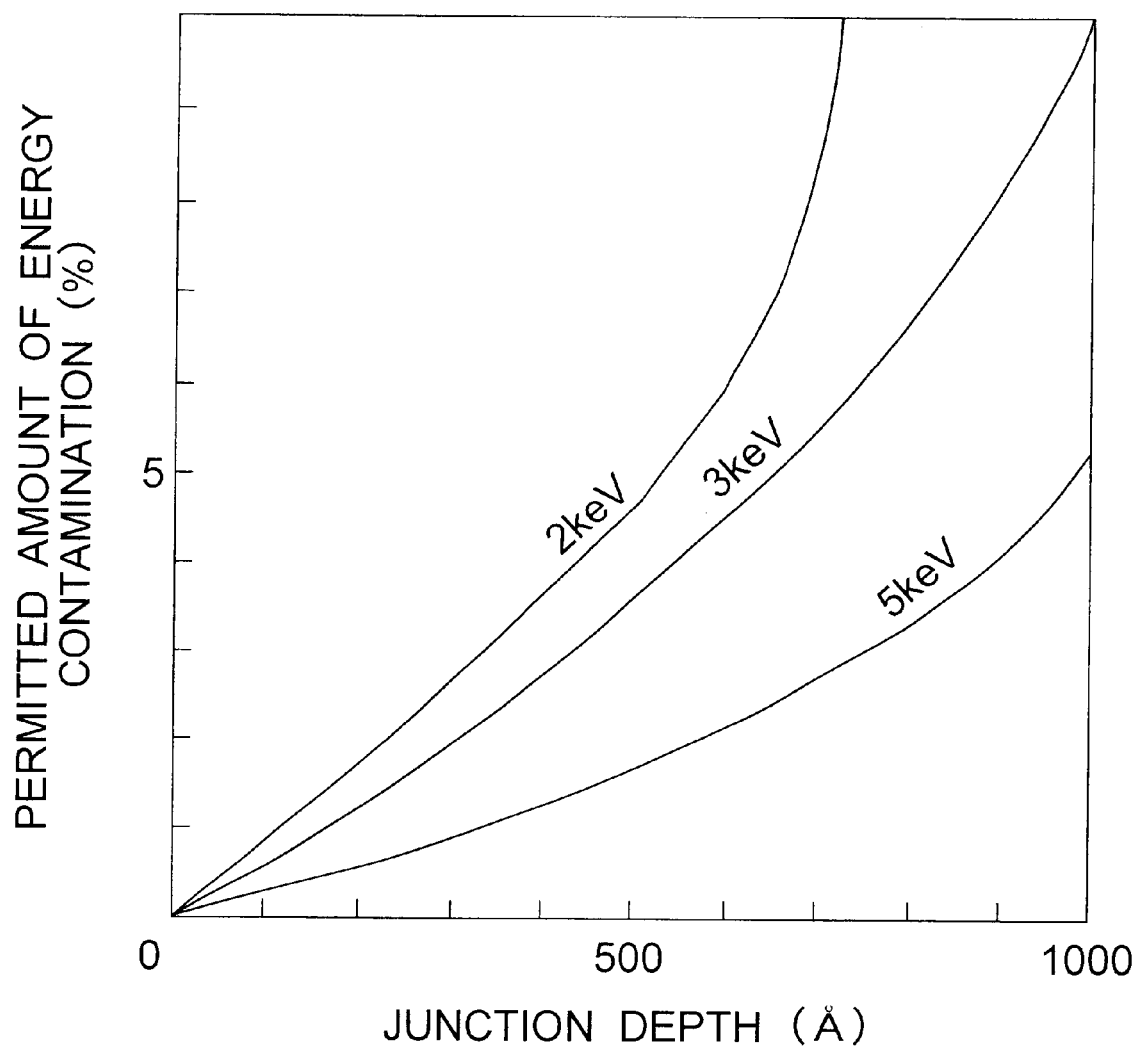
FIG. 6 is a graph showing relations between junction depths and permitted amounts of energy contamination for injection energy of 2 keV, 3 keV and 5 keV.

Similar two curves for initial energies of 3 keV, 5 keV are depicted in the graph shown in FIG. 6 in addition to the curve shown in FIG. 5.

When source/drain regions of a MOSFET are formed by injecting ions by means of a differential injection apparatus under the conditions, for example, that the initial energy is 2 keV, reduced injection energy is 0.5 keV and dosage is $5 \times 10^{14}/cm^2$ referring to the graph of FIG. 6, a permitted value of energy contamination with respect to a desired junction depth can be determined by employing the curves. That is, the degree of vacuum of the beam line of the differential ion injection apparatus is elevated and/or the length of the beam line is reduced for obtaining the energy contamination value below the upper limit of the permitted value.

Although the threshold value is described as an index of indicating the characteristics of the MOSFET, another iMdex can be used. For example, an index showing a short channel effect (Lmin) may be evaluated and a similar curve to that shown in FIG. 6 may be depicted.

Since the above embodiments are described only for examples, the present invention is not limited to the above embodiments and various modifications or alternations can be easily made therefrom by those skilled in the art without departing from the scope of the present invention.

What is claimed is:

1. In a method for establishing conditions of making an index representing characteristics of a MOSFET in a permitted range by adjusting a degree of vacuum of a beam line and/or a distance of a beam line in an ion injection apparatus based on a condition in order to form source/drain regions of the MOSFET by means of differentially injecting ions into a wafer, the improvement comprising the steps of:

plotting an amount of energy contamination with respect to a junction depth, and determining, as said condition, a permitted amount of energy contamination with respect to a desired junction depth.

2. The method as defined in claim 1, wherein a curve indicating the permitted amount of energy contamination is plotted by the steps of:

determining a junction depth by injecting the ions into the wafer under first conditions so that substantially no energy contamination occurs, annealing, and measuring the junction depth after said annealing;

determining the permitted amount of energy contamination for said junction depth by injecting ions into the wafer under second conditions so that energy contamination occurs, repeating said annealing, measuring the index to determine if said index is in the permitted range, adjusting said second conditions to increase the energy contamination if said index is in the permitted range or to decrease the energy contamination if said index is out of the permitted range, and repeating the injecting, annealing, measuring, and adjusting steps until the permitted amount of energy contamination is determined;

plotting the measured junction depth and the determined permitted amount of energy contamination; and repeating for other junction depths the above determining a junction depth, determining the permitted amount of energy contamination, and plotting steps to determine additional points on the curve.

3. The method as defined in claim 2, wherein a permitted value with respect to the junction depth exists in a region below the curve when a junction depth is taken on the abscissa axis and an amount of energy contamination is taken on the ordinate axis.

4. The method as defined in claim 1, wherein the index is a threshold voltage.

5. The method as defined in claim 1, wherein the index is that showing a short channel effect.

6. The method as defined in claim 1, wherein the degree of vacuum of the beam line is elevated or the length of the beam line is reduced to satisfy the conditions.

* * * * *